(12) United States Patent
Meuwly et al.

(10) Patent No.: US 6,875,297 B1
(45) Date of Patent: Apr. 5, 2005

(54) PROCESS FOR MANUFACTURING HIGHLY STRESSED COMPOSITE PARTS

(75) Inventors: Roger Meuwly, Cournillens (CH); Henri Hinc, Onnens (CH); Hervé Mousty, Bulle (CH); Marcel Tornare, Fribourg (CH)

(73) Assignee: Conception Et.Developpement Michelin S.A., Givisiez (CH)

( * ) Notice: Subject to any disclaimer, the term of this patent is extended or adjusted under 35 U.S.C. 154(b) by 0 days.

(21) Appl. No.: 09/633,032

(22) Filed: Aug. 4, 2000

(30) Foreign Application Priority Data

Aug. 4, 1999 (FR) .............................................. 99 10172

(51) Int. Cl.$^7$ .......................... B32B 31/04; B32B 31/28
(52) U.S. Cl. ...................... 156/180; 156/166; 156/221; 156/273.5; 156/307.1; 156/307.7
(58) Field of Search ................................. 156/166, 180, 156/221, 229, 273.5, 307.1, 307.7, 286, 242, 245; 264/137, 446, 496, 258, 324

(56) References Cited

U.S. PATENT DOCUMENTS

| | | | | |
|---|---|---|---|---|
| 3,840,985 A | * | 10/1974 | Miller .......................... | 29/611 |
| 4,065,340 A | * | 12/1977 | Dickerson .................... | 156/154 |
| 4,092,443 A | * | 5/1978 | Green ......................... | 427/519 |
| 4,233,396 A | * | 11/1980 | Armstrong et al. ......... | 264/294 |
| 4,666,954 A | | 5/1987 | Forgòet al. | |
| 4,734,144 A | * | 3/1988 | Markow ....................... | 152/516 |
| 5,098,496 A | * | 3/1992 | Breitigam et al. ........... | 156/180 |
| 5,145,621 A | * | 9/1992 | Pratt ........................... | 264/102 |
| 5,439,353 A | * | 8/1995 | Cook et al. ............. | 416/229 R |
| 5,609,806 A | | 3/1997 | Walsh et al. | |
| 6,060,124 A | * | 5/2000 | Ikegawa et al. ............ | 427/379 |
| 6,117,258 A | * | 9/2000 | Spragg et al. .............. | 152/516 |
| 6,248,450 B1 | * | 6/2001 | Voss et al. ................ | 156/307.5 |

FOREIGN PATENT DOCUMENTS

GB        1522441        8/1978

* cited by examiner

Primary Examiner—Blaine Copenheaver
Assistant Examiner—Barbara J Musser
(74) Attorney, Agent, or Firm—Cohen, Pontani, Lieberman & Pavane

(57) ABSTRACT

A process for making a composite product in which reinforcement fibers are subjected to a composition based on a thermohardening resin and a photoinitiator appropriate to the irradiation by which the composition is to be treated. The resulting pre-impregnated material is introduced into a pre-polymerization device, in which the pre-impregnated material is prepolymerized by appropriate irradiation. Lengths of the precomposite are applied to a support, the shape of which is dictated by the shape of one face of the composite part which is to be made, and are stacked one on another in a suitable number and placed snugly against the shape of the support, and the stack is subjected to final molding at a suitable pressure and temperature in order to polymerize the resin and to join the different lengths of precomposite.

48 Claims, 2 Drawing Sheets

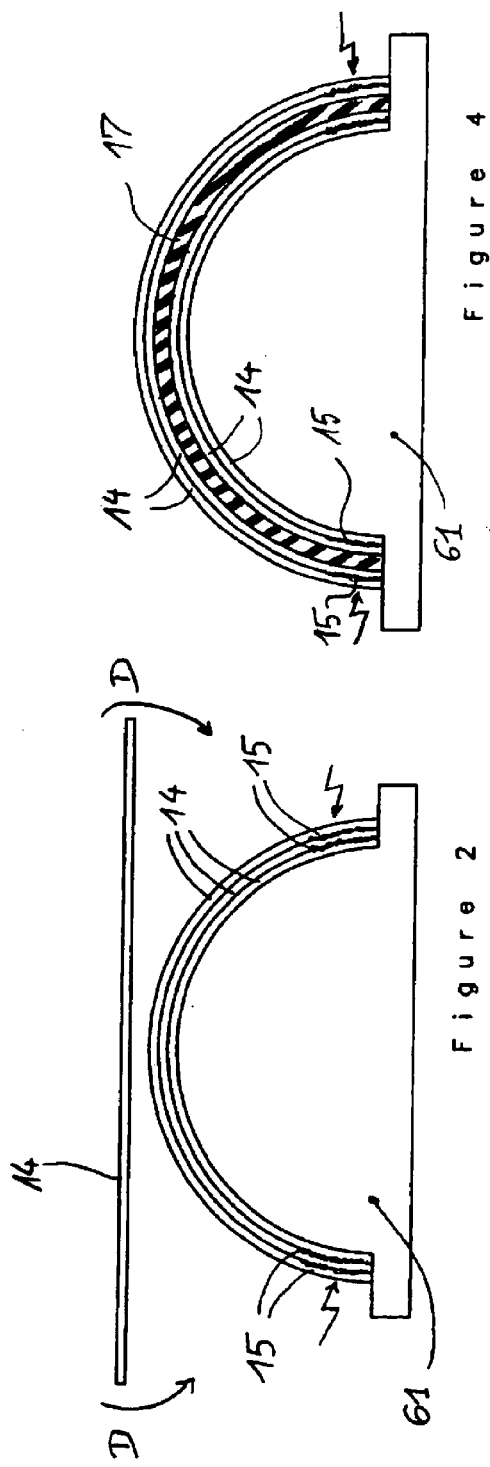

PROCESS FOR MANUFACTURING HIGHLY STRESSED COMPOSITE PARTS

BACKGROUND OF THE INVENTION

The present invention relates to processes for manufacturing composite parts, in particular in the case of parts having complex shapes. It relates more particularly to composite parts which are subject to very high mechanical stress.

One process for manufacturing composite parts consists in compression-molding a paste under high pressures, then effecting complete polymerization before demolding. The paste has been prepared beforehand, and comprises a mixture of resin and short fibers. This process is very widely used owing to its suitability for the manufacture of parts having complex shapes and to its high productivity. However, the compression-molding process is incompatible with the use of long reinforcement fibers. For this reason, it is not possible to consider producing parts which are mechanically very highly stressed by this process.

Other techniques are known which make it possible to use long reinforcement fibers. One of these techniques is referred to as "pultrusion". It consists of unwinding the fibers of unlimited length, and immersing them in a resin bath to impregnate them. Then they are drawn through a heated die, then through a heated chamber where polymerization takes place. In this manner, it is possible continuously to draw products of any section, dictated by the shape of the die. However, these are always straight products. Another known technique is filament winding. Sets of pre-impregnated reinforcement fibers are wound on a mandrel which is mobile in rotation and in translation. The manufactured object is polymerized in an oven. Tubes, or parts of large dimensions, such as reservoirs, are obtained. But apart from the fact that the variety of forms is very limited, it is difficult to position the fibers entirely in the thickness of the manufactured wall. They have a tendency to move towards the surface of the mandrel. It is also difficult to maintain a constant proportion of fibers throughout the thickness of the wall.

Also known are techniques for molding parts made of composite material which use in particular a preform which itself is molded, to facilitate the positioning of the reinforcement fibers. It was proposed in European Patent 0 655'319 to stabilize a resin preform comprising reinforcement fibers by heating the preform to obtain a pasty consistency, the viscosity of which still permits compression-molding. Then the pasty reform is demolded and is placed in a second mold which is brought to a higher temperature, in order to effect compression-molding of the pasty preform while effecting polymerization.

However, the problem of such treatment is that it is difficult to control the stage at which what shall be named "a prepolymerization" is brought about (initial partial polymerization). Now, it is necessary to achieve sufficient consistency for the later handling not to cause excessive disorganization in the positioning of the fibers. Of course, the more advanced the prepolymerization and the better the fibers are maintained, but the more difficult it becomes to change the shape during later molding of the preform. Moreover, it is furthermore very difficult, or even virtually impossible, to interrupt this polymerization process, which sometimes may be very rapid owing to the exothermic nature of the reaction. In this case, the rigidity of the reinforced resin rapidly becomes too great, which is incompatible with later molding.

Thus, except for composite parts of planar or bar-shaped or rectilinear tube-shaped form, or for other simple forms, it has not hitherto been possible individually to position long fibers exactly in the desired orientation and in a correctly controlled density within the entire thickness of the part. It may be noted that, in the aforementioned patent, the fibers are cut to facilitate the working thereof. The result is unavoidable degradation of the reinforcement effect. "Fibers of great length" or "long fibers" or "fibers of infinite length" is understood to mean fibers, the length of which is limited only by the dimensions of the part, or at least by the dimensions of those sections of the part which have to be reinforced, without this length being limited by constraints resulting from the working process. "Individually positioning" means the fact of starting from spun yarns or simple flat fabrics, and not three-dimensional fabrics which are each time specific of a single manufactured part and which themselves also pose major handling problems.

SUMMARY OF THE INVENTION

The object of the invention is to propose a process which makes it possible to manufacture composite parts without degradation of the maximum possible reinforcement effect according to the fibers selected, and which can be applied to very varied shapes, in particular very small radii of curvature. To be able to achieve the most complex shapes and also in certain cases to be able to ally the composite structure with other materials such as rubber, another object is to be able to introduce the constituents of the composite part into an open mold, such as a tire mold, which in practice rules out injection techniques. The invention aims to propose a manufacturing technique which meets the aims mentioned above and which lends itself to mechanization and to the high speeds desired for industrial manufacture.

The subject of the invention is a process for manufacturing composite parts of given thickness, comprising reinforcement fibers which are parallel to at least one preferred direction of reinforcement, said fibers being embedded in a matrix based on a composition comprising a resin which can be hardened by ionizing irradiation, the process comprising the following stages:

arranging said reinforcement fibers substantially parallel to one plane and impregnating them with said composition;

exposing the composition containing said fibers, in a layer of thickness less than given thickness, to ionizing irradiation, in order partially to polymerize the resin and to obtain a precomposite in which said composition is in the solid phase, the exposure to ionizing irradiation being stopped once an index D constituted by the Shore D hardness of the precomposite divided by the Shore D hardness of the final composite has reached a value of the order of 0.5 and before the index D has reached a value of the order of 0.7;

taking lengths from the precomposite and applying them to a support, the surface of which is non-planar in shape, by stacking them on one another in a number dictated by said given thickness, and by causing them to fit snugly against said shape of the support, and thus to create a stack of stressed lengths;

subjecting the stack to final molding at an appropriate pressure and temperature to continue the polymerization of the resin and to join the different lengths of precomposite.

The process is directed more particularly to the use of fibers of infinite length. The starting point is a spun yarn generally comprising a large number (of the order of a hundred) of elementary filaments of a diameter of several microns, these filaments all being side to side, and therefore substantially parallel to each other, apart from a few overlaps. Although it is in fact impossible to guarantee that the filaments will be arranged absolutely perfectly in parallel, the expression "substantially parallel to one plane" is intended to indicate that it is not a cabled yarn or a braid and that the filaments are arranged parallel, apart from the geometric accuracy of the arrangement. The preferred direction of reinforcement is, for example, the direction of the tensile stresses in the part to be manufactured. However, it is also possible to have as a starting point a strip or a fabric having not only fibers which are oriented parallel to each other, referred to as warp threads, which will be oriented in said preferred direction, and which furthermore contains other fibers, constituting, for example, weft threads, whatever the density thereof.

The step of impregnating the fibers is not per se specific to the present invention, as the person skilled in the art can easily select any suitable method, the impregnation possibly preceding or succeeding the phase of arranging the fibers parallel to one plane. The object of arranging the fibers parallel to one plane is that, at the latest during commencement of the polymerization of the resin, the reinforcement fibers are ordered suitably for them, in the final composite part, to be arranged suitably to obtain the reinforcement effect fully.

"Precomposite" is understood to mean a material, the resin of which is prepolymerized until it forms a solid medium (so-called gelling stage or beyond), so that the precomposite has sufficient cohesion to be installed in an open mold, with the mechanical stresses which this presupposes, without risking "wringing" of the fibers during which the amount of resin of the preform would decrease uncontrolledly. The object of the prepolymerization is therefore to achieve a minimum level of polymerization which makes it possible to avoid any flow of resin during later treatment thereof (in fact, treatment of the composite or of the article in which it will be incorporated) under the action of the temperature, or even under the action of the pressure. The object of the prepolymerization is also to achieve a minimum level of polymerization which makes it possible to impart to the precomposite resistance to buckling of its fibers upon flexure such as imposed by the stage of application on a support of non-planar shape.

The polymerization triggered by ionizing irradiation not only makes it possible to reach this stage, but also makes it possible to stop the polymerization process by stopping emission of said irradiation. In fact, the object of the prepolymerization is also not to exceed a maximum level of polymerization, which permits gluing of the precomposite either to itself or to rubber, as will be explained in detail hereafter.

The prepolymerization as proposed, associated with working of the material by lamination in sufficiently thin layers, makes it possible to reconstitute a block of any shape and thickness, compared with a monolithic material prepared with the same resin and the same fibers in an identical density, prepared, for example, by pultrusion.

As suitable ionizing irradiation, it is proposed to use irradiation within the spectrum of 300 nm to 450 run, or electron beam irradiation.

For example, a precomposite in the form of a strip of a thickness of approximately 0.1 mm is prepared (any length, selected rather according to the part to be manufactured), and the part constituted from lengths of this strip has the same properties as a monolith, that is to say, a part of simple shape which is not formed by lamination and superposition of thin layers. In other words, no degradation of the properties, which are those due to the selected resin and in particular due to the selected reinforcement fiber, is observed. It should be emphasized that, during stacking, there is nothing to prevent crossing the fibers from one length to another, according to the reinforcement effect intended for the composite part to be manufactured. This is a design parameter of the composite part which we shall not return to hereafter, but which falls within the field of the invention.

According to an advantageous embodiment of the invention, during the application of the lengths to said support, stresses are exerted on said lengths of precomposite in order to force them to fit snugly against said shape of the support. Preferably, the surface of the support against which the lengths are stacked is developable; it is easier to make them fit snugly against said surface. Preferably, the deformation stresses are maintained on said lengths of precomposite at least until the start of the heat treatment stage.

It is firstly the state of prepolymerization achieved, which is perfectly controlled due to prepolymerization by ionizing irradiation, and secondly the subdivision into several layers of low thickness, which make it possible to impose both relatively small radii of curvature without major residual stresses resulting within each length, without buckling of the fibers appearing during stacking, and without dispersion of the fibers occurring in the cross-section of the stack, in particular dispersions within the thickness. The elastic return of the stacks thus produced to a configuration in which the internal stresses would be zero is relatively slight, which makes it possible relatively easily to maintain mechanically or to freeze the deformation imposed without interfering with the later stages of production of the final composite part.

The fact of starting the polymerization of the resin in a layer of a thickness very much less than the thickness of the final composite part facilitates the deformations which have been referred to above. Considering the minimum radius of curvature "r" of said composite part, the start of polymerization is advantageously effected in a layer of thickness "e" such that "e" is smaller than "r" divided by 20. Preferably, and in particular to facilitate the temporary holding of the deformed state before the rest of the process does not definitively set the structure of the final product, the start of polymerization is effected in a layer of thickness "e" such that "e" is smaller than "r" divided by 150.

DESCRIPTION OF THE DRAWINGS

Two examples of implementation of the process according to the invention will now be described with reference to the following appended drawings:

FIG. 2 is a diagram illustrating a later phase of the process according to the invention applied to the manufacture of a composite part;

FIG. 3 is a diagram illustrating the phase following that illustrated in FIG. 2;

FIG. 4 is a diagram illustrating a later phase of the process according to the invention applied to the manufacture of a laminated part comprising both a composite part and rubber;

FIG. 5 is a diagram illustrating the phase following that illustrated in FIG. 4.

DESCRIPTION OF PREFERRED EMBODIMENTS

Figure 1:
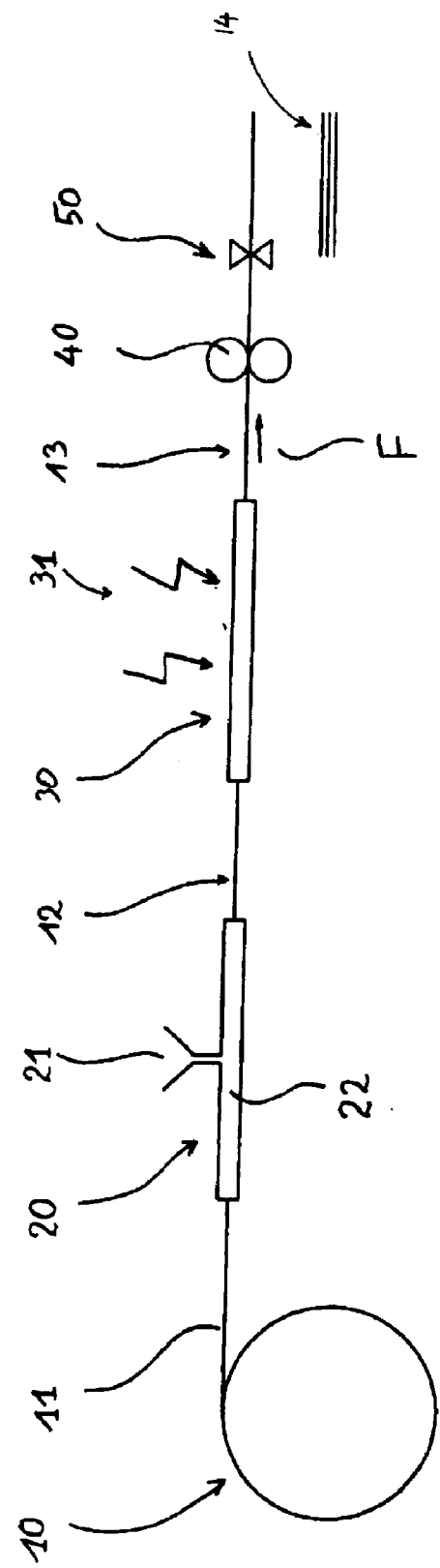
FIG. 1 is a partial diagram of an installation implementing a first phase of the process according to the invention.

FIG. 1 shows a reel 10 containing a spun yarn 11 which, in the example illustrated, is formed of glass fibers. There is then shown an impregnation device 20 comprising a reservoir 21 containing a composition based on a hardenable resin and a -photoinitiator appropriate to the irradiation by which said composition will be treated. The impregnation device 20 comprises an impregnation chamber 22. There results from this a pre-impregnated material 12 which is introduced into a prepolymerization device 30, in which the pre-impregnated material 12 is prepolymerized by ionizing irradiation, the treatment being carried out with oxygen excluded. As for the irradiation 31 to which the composition is exposed, its wavelength is typically less than 450 nanometers, preferably between 300 nm and 450 nm. For example, an ultraviolet lamp may be used. Rollers 40 drive the precomposite 13 obtained in the direction of the arrow F. Finally, shears 50 make it possible to take lengths 14 from the continuously manufactured precomposite, so that they can be worked as explained hereafter.

Then comes the phase of working of the lengths 14 of precomposite. FIG. 2 shows a support 61, the shape of which makes it possible to manufacture a C-shaped object (for example, a C-shaped spring). The lengths 14 of precomposite are deformed (see arrows D in FIG. 2) to make them fit snugly against the shape of the support 61. The lengths are arranged on the support 61 such that the fibers are parallel to the plane of FIG. 2, passing from one end of the C-shaped object to the other.

The level of prepolymerization must be sufficiently high to permit stacking of the lengths 14 on the desired support without causing buckling of the fibers 11 located within the curvature of the deformed length 14, and to prevent the resin-based composition expanding outside the precomposite during deformation, and also during later heat treatment under pressure. This level of prepolymerization must however be sufficiently low for the continuance of polymerization of a stack of several lengths of this precomposite under the joint effect of the temperature and the pressure to create bonds across the interface between two adjacent lengths of precomposite, in order to obtain an object of composite material which has excellent mechanical properties, in particular in flexion and in shearing.

It is proposed to control the level of prepolymerization experimentally by analyzing the Shore D hardness of the precomposite. The Shore hardness values given below are measured with a Shore D hardness tester as described in Standard NFT 46-052. The exposure to ionizing irradiation is preferably stopped, for example, once the Shore D hardness of the precomposite has become greater than 45, and before the Shore D hardness of the precomposite is greater than 65 if Shore D hardnesses of the order of 90 to 95 are intended for the final composite. More generally, it is proposed that the stage of exposure to ionizing irradiation be stopped once the index D constituted by the Shore D hardness of the precomposite divided by the Shore D hardness of the final composite has reached a value of the order of 0.5 and before said index D has reached a value of the order of 0.7.

It is also possible to control the level of prepolymerization experimentally by analysis of the glass transition temperature $T_g$ of the composition of the precomposite. A rule of good practice is proposed according to which, considering the index $T=T_{gf}-T_{gpr}$, $T_{gpr}$ being the glass transition temperature of the composition of the precomposite and $T_{gf}$ being the glass transition temperature of the composition of the final composite, the exposure to ionizing irradiation is stopped once the index T has become less than 120° C. and before said index T has become less than 30° C. For example, if the glass transition temperature $T_g$ of the composition of the final composite were to be of the order of 160° C., the exposure to ionizing irradiation is stopped once the glass transition temperature $T_g$ of the composition of the precomposite has reached a value of the order of 40° C. and before the glass transition temperature $T_g$ of the composition of the precomposite has reached a value of the order of 130° C.

In passing, it may be observed that the level of prepolymerization of the precomposite is such that the gelling point of the resin has been exceeded. The desired level of prepolymerization is achieved by adapting, for example, the time of treatment with ionizing irradiation (speed of travel imposed by the rollers 40, length of the prepolymerization device 30).

In order to make the precomposite fit snugly against the shape of the surface of the support 61, the following possibilities may be considered. Either said lengths 14 of precomposite are stacked and deformed individually (see arrows D in FIG. 2) to make them each fit snugly in succession against the shape of the support 61, or said lengths 14 of precomposite are stacked and deformed in groups of several lengths, or all together, to make them collectively fit snugly against the shape of the support 61.

In all cases, although the nerve of the lengths 14 is relatively weak, it is advisable to ensure that the stack of lengths of precomposite retains a C-shape, at least sufficiently to permit the implementation of the following stages. The different lengths 14 of the stack can be joined temporarily by inserting at least in part a layer 15 of said composition, for example at the ends of the C and on the surface of at least one of the lengths which are to be kept one on the other, as shown in FIG. 2. It is sufficient to expose said layer 15 at least in part to ionizing irradiation, for example visible ultraviolet irradiation, even through the lengths 14 as shown in FIG. 2, in order partially to polymerize the resin of said layer 15. Of course, as long as the bond between adjacent lengths as described above is not produced, or more generally as long as it has not been ensured that the lengths are kept spontaneously in the imposed deformation, however this may be effected, it is necessary to hold them by externally applying the appropriate forces.

In a variant of the temporary joining of the different lengths 14 by photoinitiation, it is possible to subject the stack to molding at a suitable pressure and temperature (for example of the order of 130° C.) in order to continue the prepolymerization of the resin, at least in part, before any other intermediate stages and before the final molding. In another variant, it is possible to join the different lengths 14 of the stack temporarily by interposing a temporary holding layer comprising essentially a high-viscosity composition. It should also be pointed out that these various methods may also be used concomitantly.

FIG. 3 shows the final stage. A counter-mold 62 is brought above the support 61 coated with a stack 16 of lengths 14 of precomposite. Final molding under pressure is carried out, for example of the order of 10 bar. The temperature during the molding under pressure is preferably higher than the glass transition temperature $T_g$ of the composition of the precomposite. By way of indication, a suitable treatment temperature is of the order of at least 150° C. The final properties of the material are not solely, and not even primarily, due to said prepolymerization. They also result to a great extent from the heat treatment during this final molding stage, which ensures excellent adhesion of the lengths which have first been stacked on one another.

Due to the fact that the degree of prepolymerization is not controlled thermally, it is possible to adjust the viscosity of the composition during the stage of impregnation of the fibers by moderately increasing the temperature of said composition. For example, it may be heated to about 80° C. without resulting in any significant effect on the stability of the resin. This permits far better impregnation of the fibers. Thus one can have a parameter for controlling the impregnation phase which is independent of the parameters of the later stages of the process.

As for the suitable resins, by way of illustration, we can mention that the resin may be selected from the group consisting of unsaturated vinylester resins and polyester resins, or alternatively may be an epoxy resin. And as far as the reinforcement fibers are concerned, we can mention that they may be selected from among organic fibers such as high-tenacity polyacrylic fibers or oxidized polyacrylonitrile fibers, high-tenacity polyvinyl alcohol fibers, aromatic polyamide fibers or polyamide-imide fibers or polyimide fibers, chlorofibers, high-tenacity polyester fibers or aromatic polyester fibers, high-tenacity polyethylene fibers, high-tenacity polypropylene fibers, high-tenacity cellulose or rayon or viscose fibers, polyphenylene benzobisoxazol fibers, polyethylene naphthenate fibers, or may be selected from among inorganic fibers such as glass fibers, carbon fibers, silica fibers or ceramic fibers (alumina, aluminosilicate, borosilicoaluminate). Preferably, the process uses unidirectional fibers parallel to the said at least one preferred direction of reinforcement, arranged substantially parallel during impregnation by said composition.

The following table gives comparative results on different samples 1 to 5, prepared using different resins. The samples prepared are parallelepipedal blocks of a thickness of 2 mm.

In all the examples (controls and samples), the reinforcement fibers are glass fibers, of the type indicated. In the "preparation" column, "direct molding" indicates that an equivalent monolith without any lamination was prepared; fibers which are parallel to each other are regularly distributed in the resin matrix. All the samples underwent final molding with heat treatment under pressure. Control 1 was prepared with a preimpregnated material of unidirectional fibers, commercially available under the name Prepreg Vicotex (reference BE M10/29.5%/25×2400—glass strip P122 EPOXY 60 mm), and formed of unidirectional glass fibers embedded in an epoxy resin, manufactured by Hexcel Composites S.A. Control 2 comprises spun yarns commercially available under the name PPG 2001 300Tex, embedded in a resin commercially available under the name Atlac 590. Control 3 is obtained by stacking 10 lengths of precomposite, the precomposite having been thermally prepolymerized. It comprises the same glass fibers embedded in the same resin as Control 2.

In all the examples of implementation of the invention, the composition comprises a polymerization photoinitiator and the irradiation lies within the visible ultraviolet spectrum. In this case, preferably, a glass fiber is used.

All the samples of the invention are obtained by stacking 10 lengths of precomposite of a thickness of 0.2 mm, protected by two nylon films of 50 microns. The precomposite was prepolymerized by exposure for the number of seconds indicated to visible ultraviolet irradiation (Philips UV tube TLK 40W/03) placed at a distance of 180 mm from the length. The precomposite proved sufficiently transparent to the irradiation for the prepolymerization to be very homogenous and for the temporary holding as set forth above, in which the irradiation treatment is effected through an already-prepolymerized length, to be effective.

|  | Resin | Glass fiber | Amount of fiber | Preparation | Hardening |
| --- | --- | --- | --- | --- | --- |
| Control 1 | Epoxy M10 | Vetrotex RO 99 2400 P122 | 72 | Direct molding | 1 h at 120° C. + 1 h at 150° C. |
| Control 2 | Atlac 590 | PPG 2001 300Tex | 73 | Direct molding | 15 min at 120° C. + 15 min at 165° C. |
| Control 3 | Atlac 590 | PPG 2001 300Tex | 74 | Stack 10 layers | 15 min at 120° C. + 15 min at 165° C. |
| Sample 1 | Atlac 590 | PPG 2001 300Tex | 70 | UV treatment for 30 seconds then stacking of 10 layers | 15 min at 165° C. |
| Sample 2 | Heltron 970 | PPG 2001 300Tex | 68 | UV treatment for 30 seconds then stacking of 10 layers | 15 min at 165° C. |
| Sample 3 | RD903 + stirene | PPG 2001 300Tex | 72 | UV treatment for 20 seconds then stacking of 10 layers | 15 min at 165° C. |
| Sample 4 | RD904 + stirene | PPG 2001 300Tex | 69 | UV treatment for 20 seconds then stacking of 10 layers | 15 min at 165° C. |
| Sample 5 | Derakane 470-36S | PPG 2001 300Tex | 72 | UV treatment for 20 seconds then stacking of 10 layers | 15 min at 165° C. |

The resins of controls 2 and 3 and of all the samples are all vinylester resins. (Epoxy Vinyl Ester Resins). The supplier of the resin ATLAC 590 is DSM-BASF Structural Resins. Note in passing that, in a variant of what was stated in the previous paragraph, the viscosity of said composition can be adjusted by adding thereto a monomer which can be copolymerized with the resin and by varying the proportion of said monomer. For example, the monomer whose proportion is varied is a stirene. The photoinitiator is bis(2,4,6-trimethylbenzoyl)-phenylphosphine oxide (photoinitiator Irgacure 819). The supplier of the resin "Heltron 970" is Ashland Chemical. The supplier of the resins "RD903" and "RD904" is UCB Chemicals. The supplier of the resin "Derakane 470-36S" is Dow.

The resin ATLAC 590 is an epoxy resin unsaturated by an unsaturated monocarboxylic acid (see formula below). This resin comprises:

a resin based on bisphenol A, the bisphenol A appearing between the square brackets,

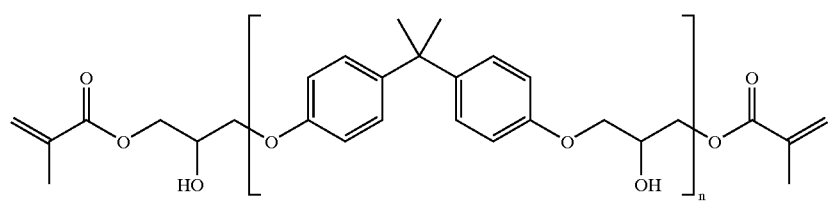

a novolac resin appearing between the square brackets:

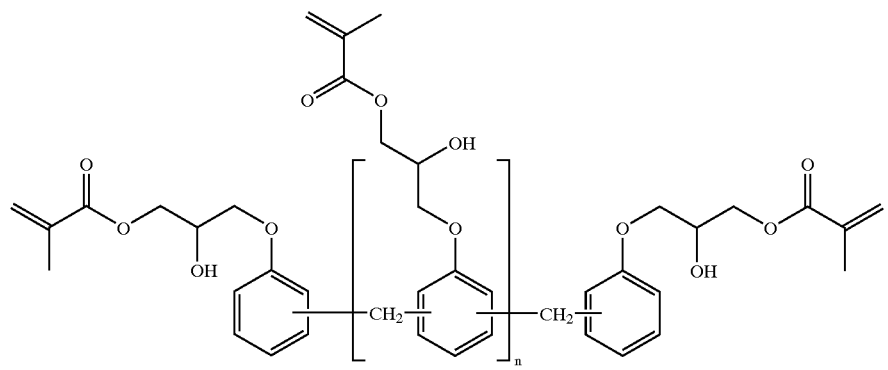

a monomer, the portion of which influences the viscosity, stirene:

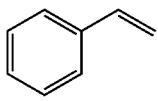

The following table illustrates the mechanical properties.

|  | Young's modulus (MPa) | Flexion test Breaking stress (MPa) | Shearing test Breaking stress (MPa) |
| --- | --- | --- | --- |
| Control 1 | 40977 | 1374 | 78 |
| Control 2 | 37142 | 1145 | 83 |
| Control 3 | 28140 | 733 | 28 |
| Sample 1 | 40956 | 1184 | 78 |
| Sample 2 | 33366 | 1050 | 82 |
| Sample 3 | 39080 | 1111 | 81 |
| Sample 4 | 35486 | 1050 | 77 |
| Sample 5 | 40548 | 1025 | 76 |

Controls 1 and 2 illustrate the better performances which may be expected of a correctly prepared monolith. The mechanical performances of the samples are illustrated by the values of the Young's modulus, by the maximum stress at break of the sample in the flexion test (AFNOR Standard T57-302), and by the maximum shear stress at break (AFNOR Standard T57-303), the latter property making it possible in particular to demonstrate well the quality of the connection between the strata of the control 3 and the sample according to the invention. Significant degradation of the properties of Control 3 are observed, in particular considerable degradation of the maximum shear stress at break. On the other hand, the invention makes it possible to obtain substantially the properties of Control 2, which is a directly comparable monolith. The mechanical properties of the material are the same, whether the lengths of precomposite have been deformed or not.

The following table illustrates the partial polymerization treatment. It gives a qualitative description of the precomposite obtained for different values of the ultraviolet irradiation treatment time. The samples in question contain glass fibers PPG 300 Tex to 70% by weight, embedded in a resin Atlac 590 with 2% of photoinitiator Irgacure 819. The precomposite is prepared in a layer of a thickness of 0.25 mm and 30 mm width, the glass fibers being unidirectional. The layer is protected at the surface by a nylon film of a thickness of 50 microns for the irradiation. The irradiation is effected by 2 Philips UV tubes TLK 40W/03 placed at a distance of 180 mm from the layer to be treated. Thus a stack of 15 lengths of 30 mm of precomposite is formed. The resistance to buckling is evaluated by manual winding of a sample oriented in the direction of the fibers on a cylinder of a radius of 30 mm. The resistance is evaluated at a pressure of 30 bars, at a temperature of 110° C. The Shore D hardness is measured in accordance with the standard already mentioned.

| Time of exposure to UV irradiation (sec) | Surface appearance | Shore D hardness | Resistance to buckling | Resistance to pressure |
| --- | --- | --- | --- | --- |
| 10 | tacky | 20 | numerous bucklings | composite crushed, resin exuded |
| 20 | non-tacky | 35 | bucklings | composite crushed |
| 25 | non-tacky | 45 | little buckling | composite not crushed |
| 27 | non-tacky | 50 | no buckling | composite not crushed |
| 30 | non-tacky | 65 | no buckling | composite not crushed |
| 40 | non-tacky | 75 | no buckling | composite not crushed |
| 60 | non-tacky | 80 | no buckling | composite not crushed |

It can be seen that satisfactory results are obtained from a treatment time of greater than 25 seconds onwards. The irradiation stage is preferably limited in time once the suitable Shore D hardness has been reached, the reader being referred to the explanations already given.

Thus the invention also extends to a laminated composite material of non-planar form, comprising reinforcement fibers parallel to at least one preferred direction of reinforcement, each fiber being entirely contained in a single stratum, said fibers being embedded in a matrix based on a composition comprising a resin which can be hardened by ionizing irradiation, in which each stratum is of a thickness of less than 0.3 millimeters, in which the glass transition temperature $T_g$ of the matrix is greater than 150° C., which the Shore D hardness of the material is greater than 80. In particular, each stratum is of non-planar, developable form. The material is preferably such that the modulus of flexure is greater than 30000 MPa, the breaking stress upon flexure is greater than 1000 MPa, and the breaking stress under shear is greater than 70 MPa.

The invention makes it possible to obtain an intermediate product formed essentially of a precomposite prepared in a great length and in a width of less than 0.3 millimeters, comprising reinforcement fibers which are parallel to at least one preferred direction of reinforcement, said fibers being embedded in a matrix based on a composition comprising a resin which can be hardened by ionizing irradiation, in which the glass transition temperature $T_g$ of the matrix is between 40° C. and 130° C., and in which the Shore D hardness of this precomposite is between 50 and 65, coated with a protective film which is opaque to visible ultraviolet irradiation. Owing to the protective film, this intermediate product may be stored without the rate of prepolymerization changing substantially. It may be used on another site and applied in accordance with the details of the process of the invention.

According to another specific aspect, the invention relates to a process for joining a composite material to rubber. The process described makes it possible to produce a laminate in which said composite parts are intimately joined to rubber. To this end, and preferably, on the surface of each length intended to receive a layer of rubber, there is deposited a layer of resorcinol formaldehyde latex glue (RFL), said layer of glue RFL being dried without reaching a temperature of greater than 100° C., that is to say, without heat treatment at high temperature, before receiving said layer of rubber. During the final molding, good joining of the lengths of precomposite to each other and to the composite elements and the rubber is obtained.

The invention therefore also extends to a material in which, between at least some of said strata, there is interposed a layer 17 of composition based on sulphur-vulcanizable elastomer. Advantageously, between at least some of said strata and said layer of composition based on sulphur-vulcanizable elastomer, there is interposed a layer of resorcinol formaldehyde latex glue (RFL).

FIG. 4 shows the support 61 first of all covered by two stacked lengths 14 of precomposite, which are deformed and held temporarily by a layer 15 of the composition prepolymerized by ultraviolet irradiation. The two strata thus deposited and prestabilized spontaneously retain their C-shape. A layer 17 of a composition based on uncured rubber is then laid on top of the second length 14. Of course, the rubber-based composition can fit snugly against the form imposed on the first layers of precomposite without great difficulty. Then the stacking of lengths 14 of precomposite can be continued, with temporary maintenance of the deformed state. It is of course possible to use all the means described for FIG. 2.

The final molding stage, illustrated in FIG. 5, both makes it possible for the lengths 14 to adhere well to each other, permits vulcanization of the rubber, complete polymerization of the resin and joining of the rubber and the resin. A counter-mold 63 is brought above the support 61 coated with a stack 18 of lengths 14 of precomposite with the interposition of a layer 17 of rubber. Final molding is effected with heat treatment under pressure. The use of a non-polymerized RFL glue, laid on these lengths of precomposite, means that it is possible not to have to use special elastomers to glue the rubber to the composite material.

We claim:

1. A process for manufacturing composite parts of given thickness, comprising reinforcement fibers which are parallel to at least one preferred direction of reinforcement, said fibers being embedded in a matrix based on a composition comprising a resin which can be hardened by ionizing irradiation, the process comprising:

arranging said reinforcement fibers substantially parallel to one plane and impregnating them with said composition;

exposing the composition containing said fibers, in a layer of thickness less than said given thickness, to ionizing irradiation, in order partially to polymerize the resin and to obtain a precomposite in which said composition is in a solid phase, the exposure to ionizing irradiation being stopped once an index D constituted by the Shore D hardness of the precomposite divided by the Shore D hardness of the final composite has reached a value of the order of 0.5 and before said index D has reached a value of the order of 0.7;

taking lengths from the precomposite and applying said lengths to a support, the surface of which is non-planar in shape, by stacking said lengths on one another in a number dictated by said given thickness, and by causing said lengths to fit snugly against said shape of the support, and thus to create a stack of stressed lengths; and subjecting said stack of stressed lengths to final molding at a suitable pressure and temperature to continue the polymerization of the resin and to join said lengths of the precomposite.

2. A process according to claim 1, in which the surface of the support is developable.

3. A process according to claim 1, in which said composite part has a curvature, and in which, considering a minimum radius of curvature "r" of said composite part, the start of prepolymerization is effected in a layer of thickness "e" is such that "e" is smaller than r/20.

4. A process according to claim 1, in which said composite part has a curvature, and in which, considering a minimum radius of curvature "r" of said composite part, the start of prepolymerization is effected in a layer of thickness "e" is such that "e" is smaller than r/150.

5. A process according to claim 1, in which said lengths of precomposite are stacked and deformed individually to make them each fit snugly in succession against said shape of the support.

6. A process according to claim 1, in which said lengths of precomposite are stacked and deformed in groups of several lengths to make them fit snugly collectively against said shape of the support.

7. A process according to claim 1, in which the temperature during the molding under pressure in the final molding stage is higher than the glass transition temperature Tg of the composition of the precomposite.

8. A process according to claim 1, in which the stage during which said composition is exposed to ionizing irradiation is carried out with oxygen excluded.

9. A process according to claim 1, in which, during the application of the lengths to said support, stresses are exerted externally on said lengths of precomposite in order to force them to fit snugly against said shape of the support, and said stresses are kept exerted externally at least until the start of the heat treatment stage.

10. A process according to claim 1, in which the lengths of the precomposite that are stacked on one another are joined temporarily by inserting at least in part a layer of said composition, and by exposing said inserted layer, at least in part, to ionizing irradiation, in order to prepolymerize the resin of said inserted layer.

11. A process according to claim 1, in which the lengths of the precomposite that are stacked on one another are joined temporarily by being subjected to pre-molding at a suitable pressure and temperature in order to continue the polymerization of the resin, at least in part, before any other intermediate stages and before the final molding.

12. A process according to claim 1, in which the lengths of the precomposite that are stacked on one another are joined temporarily by inserting a temporary holding layer comprising essentially a high-viscosity composition.

13. A process according to claim 12, in which the viscosity of said composition is adjusted, during the stage of impregnation of the fibers, by increasing the temperature of said composition.

14. A process according to claim 1, in which the resin is selected from the group consisting of unsaturated vinylester resins and polyester resins.

15. A process according to claim 1, in which the resin is an epoxy resin.

16. A process according to claim 14, in which said composition comprises a monomer which can be copolymerized with the resin and the viscosity of said composition is adjusted by varying the proportion of monomer.

17. A process according to claim 16, in which said monomer is styrene.

18. A process according to claim 1, in which said composition comprises a polymerization photoinitiator and the irradiation lies within the visible ultraviolet spectrum.

19. A process according to claim 14, in which said composition comprises a polymerization photoinitiator which is bis (2,4,6-trimethylbenzoyl)-phenylphosphine oxide and the irradiation lies within the visible ultraviolet spectrum.

20. A process according to claim 1, in which the reinforcement fibers are selected from the group consisting of high-tenacity polyacrylic fibers, oxidized polyacrylonitrile fibers, high-tenacity polyvinyl alcohol fibers, aromatic polyamide fibers, polyamide-imide fibers, polyimide fibers, chlorofibers, high-tenacity polyester fibers, aromatic polyester fibers, high-tenacity polyethylene fibers, high-tenacity polypropylene fibers, cellulose fibers, rayon fibers, high-tenacity viscose fibers, polyphenylene benzobisoxazol fibers, polyethylene naphthenate fibers, glass fibers, carbon fibers, silica fibers and ceramic fibers.

21. A process according to claim 18, in which the reinforcement fiber is glass.

22. A process according to claim 1, in which a layer of composition based on sulphur-vulcanizable elastomer is interposed between some of the lengths of precomposite.

23. A process according to claim 22, in which, on the surface of each length intended to receive a layer of composition based on sulphur-vulcanizable elastomer, there is deposited a layer of resorcinol formaldehyde latex glue (RFL), said layer of REL glue being dried without reaching a temperature of greater than 100° C., before receiving said layer of composition based on sulphur-vulcanizable elastomer.

24. A process according to claim 22, including, in the final molding stage, joining the layers of the stack, vulcanizing the composition based on sulphur-vulcanizable elastomer, polymerizing completely the resin and joining the composition based on sulphur-vulcanizable elastomer and the resin.

25. A process for manufacturing composite parts of given thickness, comprising reinforcement fibers which are parallel to at least one preferred direction of reinforcement, said fibers being embedded in a matrix based on a composition comprising a resin which can be hardened by ionizing irradiation, the process comprising the following stages:

arranging said reinforcement fibers substantially parallel to one plane and impregnating them with said composition;

exposing the composition containing said fibers, in a layer of thickness less than said given thickness, to ionizing irradiation, in order partially to polymerize the resin and to obtain a precomposite in which said composition is in a solid phase, the exposure to ionizing irradiation being stopped once an index $T=T_{gf}-T_{gpr}$, $T_{gpr}$, being the glass transition temperature of the composition of the precomposite and $T_{gf}$ being the glass transition temperature of the composition of the final composite, has become less than 120° C. and before said index T has become less than 30° C.;

taking lengths from the precomposite and applying said lengths to a support, the surface of which is non-planar in shape, by stacking said lengths on one another in a number dictated by said given thickness, and by causing said lengths to fit snugly against said shape of the support, and thus to create a stack of stressed lengths; and subjecting said stack of stressed lengths to final molding at a suitable pressure and temperature to continue the polymerization of the resin and to join said lengths of the precomposite.

26. A process according to claim 25, in which the surface of the support is developable.

27. A process according to claim 25, in which said composite part has a curvature, and in which, considering a minimum radius of curvature "r" of said composite part, the start of prepolymerization is effected in a layer of thickness "e" is such that "e" is smaller than r/20.

28. A process according to claim 25, in which said composite part has a curvature, and in which, considering a minimum radius of curvature "r" of said composite part, the start of prepolymerization is effected in a layer of thickness "e" is such that "e" is smaller than r/150.

29. A process according to claim 25, in which said lengths of precomposite are stacked and deformed individually to make them each fit snugly in succession against said shape of the support.

30. A process according to claim 25, in which said lengths of precomposite are stacked and deformed in groups of several lengths to make them fit snugly collectively against said shape of the support.

31. A process according to claim 25 in which the temperature during the molding under pressure in the final molding stage is higher than a glass transition temperature Tg of the composition of the precomposite.

32. A process according to claim 25, in which the stage during which said composition is exposed to ionizing irradiation is carried out with oxygen excluded.

33. A process according to claim 25, in which, during the application of the lengths to said support, stresses are exerted externally on said lengths of precomposite in order to force them to fit snugly against said shape of the support, and said stresses are kept exerted externally at least until the start of the heat treatment stage.

34. A process according to claim 25, in which the lengths of the precomposite that are stacked on one another are joined temporarily by inserting at least in part a layer of said composition, and by exposing said inserted layer, at least in part, to ionizing irradiation, in order to prepolymerize the resin of said inserted layer.

35. A process according to claim 25, in which the different lengths of the precomposite that are stacked on one another are joined temporarily by being subjected to pre-molding at a suitable pressure and temperature in order to continue the polymerization of the resin, at least in part, before any other intermediate stages and before the final molding.

36. A process according to claim 25, in which the lengths of the precomposite that are stacked on one another are joined temporarily by inserting a temporary holding layer comprising essentially a high-viscosity composition.

37. A process according to claim 25, in which the viscosity of said composition is adjusted, during the stage of impregnation of the fibers, by increasing the temperature of said composition.

38. A process according to claim 25, in which the resin is selected from the group consisting of unsaturated vinylester resins and polyester resins.

39. A process according to claim 25, in which the resin is an epoxy resin.

40. A process according to claim 38, in which said composition comprises a monomer which can be copolymerized with the resin and the viscosity of said composition is adjusted by varying the proportion of monomer.

41. A process according to claim 40, in which said monomer is styrene.

42. A process according to claim 25, in which said composition comprises a polymerization photoinitiator and the irradiation lies within the visible ultraviolet spectrum.

43. A process according to claim 38, in which said composition comprises a polymerization photoinitiator which is bis(2,4,6-trimethylbenzoyl)-phenylphosphine oxide and the irradiation lies within the visible ultraviolet spectrum.

44. A process according to claim 25, in which the reinforcement fibers are selected from the group consisting of high-tenacity polyacrylic fibers, oxidized polyacrylonitrile fibers, high-tenacity polyvinyl alcohol fibers, aromatic polyamide fibers, polyamide-imide fibers, polyimide fibers, chlorofibers, high-tenacity polyester fibers, aromatic polyester fibers, high-tenacity polyethylene fibers, high-tenacity polypropylene fibers, cellulose fibers, rayon fibers, high-tenacity viscose fibers, polyphenylene benzobisoxazol fibers, polyethylene naphthenate fibers, glass fibers, carbon fibers, silica fibers and ceramic fibers.

45. A process according to claim 42, in which the reinforcement fiber is glass.

46. A process according to claim 25, in which a layer of composition based on sulphur-vulcanizable elastomer is interposed between some of the lengths of precomposite.

47. A process according to claim 46 in which, on the surface of each length intended to receive a layer of composition based on sulphur-vulcanizable elastomer, there is deposited a layer of resorcinol formaldehyde latex glue (RFL), said layer of RFL glue being dried without reaching a temperature of greater than 100° C., before receiving said layer of composition based on sulphur-vulcanizable elastomer.

48. A process according to claim 46, including, in the final molding stage, joining the layers of the stack, vulcanizing the composition based on sulphur-vulcanizable elastomer, polymerizing completely the resin and joining the composition based on sulphur-vulcanizable elastomer and the resin.

* * * * *